(12) United States Patent
Dominguez et al.

(10) Patent No.: US 8,425,987 B2
(45) Date of Patent: Apr. 23, 2013

(54) SURFACE CHARGE ENHANCED ATOMIC LAYER DEPOSITION OF PURE METALLIC FILMS

(75) Inventors: Juan E. Dominguez, Hillsboro, OR (US); Adrien R. Lavoie, Beaverton, OR (US); John J. Plombon, Portland, OR (US); Harsono S. Simka, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 614 days.

(21) Appl. No.: 12/347,940

(22) Filed: Dec. 31, 2008

(65) Prior Publication Data

US 2010/0166981 A1 Jul. 1, 2010

(51) Int. Cl.
*C23C 8/00* (2006.01)
*C23C 16/00* (2006.01)

(52) U.S. Cl.
USPC ................ 427/585; 427/255.23

(58) Field of Classification Search ............ 427/576, 427/533, 534, 535, 536, 538, 540, 551, 552, 427/595, 596, 597, 250, 252, 255.23, 255.28
See application file for complete search history.

(56) References Cited

U.S. PATENT DOCUMENTS

| | | | | |
|---|---|---|---|---|
| 4,464,416 A | * | 8/1984 | Liepins | 427/576 |
| 6,572,933 B1 | * | 6/2003 | Nastasi et al. | 427/523 |
| 6,878,417 B2 | * | 4/2005 | Polanyi et al. | 427/533 |
| 2002/0164423 A1 | * | 11/2002 | Chiang et al. | 427/255.28 |
| 2004/0045909 A1 | * | 3/2004 | Tomioka et al. | 210/748 |
| 2008/0081127 A1 | * | 4/2008 | Thompson et al. | 427/569 |

OTHER PUBLICATIONS

Beaulieu, Electron Beam Chemical Vapor Deposition of Platinum and Carbon. 2005, Georgia Institute of Technology, M.S. thesis.*
Perng, K, et al., "Study on biased-enhanced nucleation of diamonds by stimulating the time dependence of bias current", *Journal of Applied Physics*, vol. 91, No. 6, (Mar. 2002), 3934-3936.
Stockel, R, et al., "Diamond nucleation under bias conditions", *J. Appl. Phys.*, 83 (1), (Jan. 1998), 531-539.

* cited by examiner

*Primary Examiner* — Dah-Wei Yuan
*Assistant Examiner* — Nga Leung V Law
(74) *Attorney, Agent, or Firm* — Blakely, Sokoloff, Taylor & Zafman LLP

(57) ABSTRACT

A method including applying an electric charge to a substrate in a chamber; introducing an organometallic substituent into the chamber, the organometallic substituent including a metal ligand and an organic ligand; and depositing a metal film by reducing the metal ligand of the organometallic substituent. A method including applying a removable electric charge to a substrate; in the presence of the applied electric charge, introducing an organometallic substituent into the chamber, the organometallic substituent including a metal ligand and an organic ligand; and depositing a metal film by reducing the metal ligand of the organometallic substituent. A method including introducing an organometallic substituent into the chamber, the organometallic substituent including a metal ligand and an organic ligand; and depositing a metal film by reducing the metal ligand of the organometallic substituent with an externally applied electric charge.

13 Claims, 4 Drawing Sheets

SURFACE CHARGE ENHANCED ATOMIC LAYER DEPOSITION OF PURE METALLIC FILMS

BACKGROUND

1. Field

Integrated circuit processing.

2. Description of Related Art

Modern integrated circuits use conductive interconnections to connect the individual devices on a chip or to send and/or receive signals external to the device(s). Common types of interconnections include copper and copper alloy interconnections (lines) coupled to individual devices, including other interconnections (lines) by interconnections through vias.

A typical method of forming an interconnection, particularly a copper interconnection, is a damascene process. A typical damascene process involves forming a via and an overlying trench in a dielectric to an underlying circuit device, such as a transistor or an interconnection. The via and trench are then lined with a barrier layer of a refractory material, such as titanium nitride (TiN), tungsten nitride (WN), tantalum (Ta), or tantalum nitride (TaN). The barrier layer serves, in one aspect, to inhibit the diffusion of the interconnection material that will subsequently be introduced in the via and trench into the dielectric. Next, an adhesion layer may be formed on the barrier layer to improve the adhesion of a subsequently formed conductive interconnection to the barrier layer or the via and/or trench. Suitable materials for an adhesion layer include titanium (Ti), tantalum (Ta) and ruthenium (Ru). Next, a suitable seed material is deposited on the wall or walls of the via and trench. Suitable seed materials for the deposition of copper interconnection material include copper (Cu), nickel (Ni), cobalt (Co), and ruthenium (Ru). Next, interconnection material, such as copper, is introduced by electroplating or physical deposition in a sufficient amount to fill the via and trench and complete the interconnect structure. Once introduced, the interconnection structure may be planarized and a dielectric material (including an interlayer dielectric material) introduced over the interconnection structure to suitably isolate the structure.

Barrier layer and adhesion layer formation may be conducted by physical vapor deposition (PVD). In a PVD process, a surface of a substrate may be activated using temperature or a plasma which can degrade the surface. As via and trench widths become smaller, the conductivity and fill ability of an interconnection may be changed. For example, PVD deposition of a barrier layer into a narrow via or trench is typically not conformal (e.g. uniform thickness of the via or trench). In addition, an overhang of the PVD-deposited material at an opening of the via or trench may pinch-off the via or trench and inhibit the ability to fill the via or trench with conductive material.

Barrier layer and adhesion layer formation may also be formed by chemical vapor deposition (CVD) or atomic layer deposition (ALD). Such deposition processes also generally use increased temperature and/or plasma to drive off undesired ligands (ALD) or to activate a surface which can damage the substrate. In the case of CVD, conformality of a deposited film can be less than optimal.

DETAILED DESCRIPTION

Figure 1:
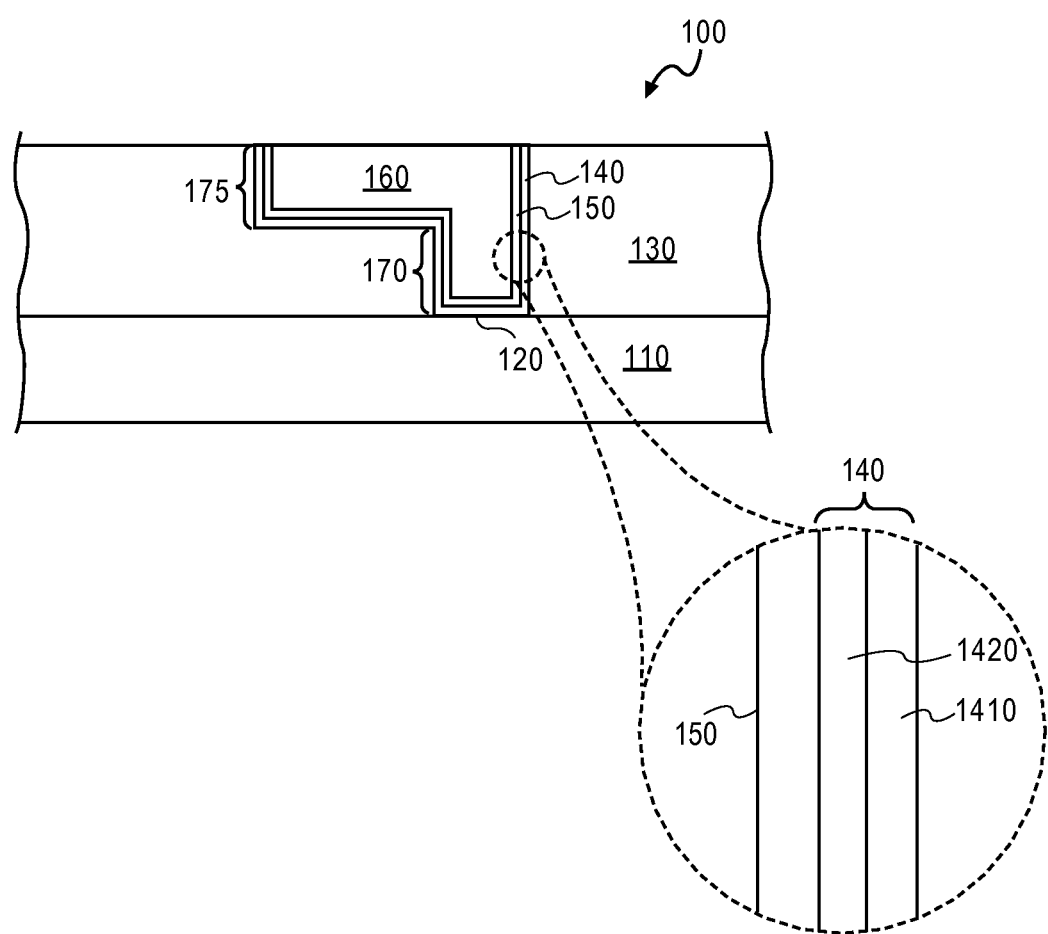
FIG. 1 shows a schematic, cross-sectional side view of an interconnect structure.

FIG. 1 shows a typical integrated circuit structure, such as a portion of a microprocessor chip on a silicon wafer. A typical integrated circuit such as a microprocessor chip may have, for example, multiple interconnection layers or levels separated from one another by interlayer dielectric material. Structure 100 includes an interconnection line over substrate 110. Substrate 110 may be the wafer substrate having circuit devices, including transistors, thereon as well as one or more levels of interconnection to devices. FIG. 1 shows contact point 120 that may be a circuit device formed on or in a wafer or an interconnection line formed above the wafer to devices on the wafer. It is to be appreciated that the techniques described herein may be used for various interconnections within an integrated circuit including to circuit devices and other interconnections. In this sense, contact point 120 represents such devices or interconnections where an interconnection contact is made.

FIG. 1 illustrates a cross-sectional side view of a portion of a substrate. Overlying substrate 110 is dielectric material 130. Dielectric material 130 is, for example, silicon dioxide ($SiO_2$) formed by a tetraethyl orthosilicate (TEOS) or a plasma enhanced chemical vapor deposition (PECVD) source. Dielectric material 130 may also be a material having, for example, a dielectric constant (k) less than the dielectric constant of $SiO_2$ (e.g., a "low k" material), including polymers as known in the art.

FIG. 1 shows via 170 through dielectric material 130 to expose contact point 120. FIG. 1 also shows trench 175 formed in a portion of dielectric material 130 over via 170. A trench and via may be formed according to known techniques by, for example, initially using a mask, such as a photoresist mask, to define an area (e.g., a cross-sectional area) for a via opening and etching the via with a suitable chemistry, such as, for example, a $CH_3F/CF_4$ or $C_4F_8$ etch chemistry for $SiO_2$. The mask may then be removed (such as by an oxygen plasma to remove photoresist) and a second mask patterned to define, for example, a greater area (e.g., a greater cross-sectional area) for a trench opening. A subsequent mask and etch is introduced to form a trench and the second mask is removed leaving the substrate shown in FIG. 1.

FIG. 1 further shows the substrate having first material 140 formed along the sidewalls of the via and trench opening. In one embodiment, first material 140 is deposited to a thickness of approximately 0.5 to 25 nanometers (nm) depending on the desired characteristics of the material. A deposition process employing ALD or CVD processing is described in detail below. First material 140 may be a single layer or a composite material of a number of layers including, in one embodiment, barrier layer 1410 (see inset) to be effective to inhibit interconnect material diffusion, such as copper diffusion into dielectric material 130. Barrier layer 1410 may also be chosen for its adhering properties to dielectric material 130. Suitable materials for barrier layer 1410 include tantalum (Ta), manganese (Mn), manganese oxide ($MnO_x$), mangane-sesilicates ($Mn_xO_ySi_z$), tantalum nitride (TaN), tantalum silicon nitride (TaSiN), tungsten (W), tungsten nitride (WN), tungsten silicon nitride (WSiN), titanium (Ti), titanium nitride (TiN), titanium silicon nitride (TiSiN), and cobalt or molybdenum (Co) and their nitrides.

Separated from dielectric material 130 by barrier layer 1410 may be adhesion layer 1420 as part of composite layers that make up first material 140 (see FIG. 1, inset). Adhesion layer 1420 may be chosen for its property to adhere to barrier layer 1410 and/or its property to promote the adhesion of an interconnection material subsequently introduced in via 170 and/or trench 175. Representatively, transition metals such as tantalum and titanium are suitable materials for adhesion layer 1420, particularly where an underlying barrier layer (e.g., barrier layer 1410) includes similar elements.

Referring to FIG. 1, overlying first material 140 as a blanket including along the sidewalls and bottom of via 170 and trench 175 is second material 150. Second material 150 is used, in one sense, in connection with a subsequent electroplating process to form an interconnection in via 170 and trench 175. While first material 140 may be a conductive material such as a tantalum compound that may be capable of carrying a current utilized in an electroplating process, first material 140 may also not be a good conductor and may cause non-uniform current flow which, in turn, may adversely affect the electroplating process and the reliability of the interconnection. Second material 150, on the other hand, generally provides uniform current flow during electroplating and, in one sense, serves as a seed material for electroplating the interconnection. Moreover, second material 150 may be selected to provide enhanced adhesion of the subsequently formed interconnection to the substrate.

In one embodiment, second material 150 is, for example, a copper material introduced using chemical or physical deposition techniques or, alternatively, by a process as described in detail below. A thickness of second material 150 along the sidewalls and bottom of via 170 and trench 175 of less than 3,000 angstroms (Å) is suitable.

FIG. 1 shows structure 100 after filling via 170 and trench 175 with interconnection material 160 of, for example, a copper material. The typical introduction technique for a copper interconnection material as noted above is an electroplating process. By way of example, a typical electroplating process involves introducing a substrate (e.g., a wafer) into an aqueous solution containing metal ions, such as copper sulfate-based solution, and reducing the ions (reducing the oxidation number) to a metallic state by applying current between substrate with second material 150 and an anode of an electroplating cell in the presence of the solution. Copper metal is deposited on to second material 150 to fill via 170 and trench 175 and form copper interconnection material 160.

In one embodiment, interconnection material 160 and or second material 150 is copper or a copper alloy. Suitable copper alloys include copper tin (CuSn), copper-aluminum (CuAl), copper-indium (CuIn), copper-cadmium (CuCd), copper-zinc (CuZn), copper-bismuth (CuBi), copper-ruthenium (CuRu), copper-rhodium (CuRh), copper-rhenium (CuRe), copper-tungsten (CuW), copper-cobalt (CuCo), copper-palladium (CuPd), copper-gold (CuAu), copper-platinum (CuPt), copper-manganese (CuMn), and copper-silver (CuAg). Alloys are generally formed by one of two methods. Typically, copper-tin, copper-aluminum, copper-manganese, copper-indium, copper-cadmium, copper-bismuth, copper-ruthenium, copper-rhenium, copper-rhodium, and copper-tungsten are electroplated. Alternatively, copper may be doped with catalytic metals such as silver, platinum, tin, rhodium, and ruthenium by introducing a contact displacement layer on top of planarized copper interconnection material (see next paragraph) and applying a thermal anneal to form an alloy.

Structure 100 may be planarized such as by a chemical-mechanical polish as known in the art to dielectric material 130 to remove first material 140, second material 150, and any interconnection material 160 present on the upper surface of dielectric material 130. FIG. 1 shows structure 100 having interconnect material 160, second material 150 and first material 140 introduced into via 170 and trench 175 with the surface of dielectric material 130 and the interconnect structure planarized.

Referring again to first material 140, in one embodiment, first material 140 is formed according to an atomic layer deposition (ALD) or chemical vapor deposition (CVD) process. Generally speaking, an ALD process involves forming a film layer-by-layer by exposing a surface to alternating pulses of reactants, each of which undergoes a self-limiting reaction, generally resulting in controlled film deposition. An advantage to using an ALD process in forming a barrier layer between a dielectric and a conductor (such as a barrier between a dielectric and an interconnect) is the barrier layer may be uniform, continuous and conformal. A CVD process involves introducing a precursor in a gas state and converting the precursor from a gas to a solid state on the substrate.

In one embodiment, first material 140 includes a barrier layer (e.g., barrier layer 1410) and an adhesion layer (adhesion layer 1420) each formed by an ALD process involving introducing an organometallic precursor in the presence of a substrate. Although FIG. 1 shows discrete layers for barrier layer 1410 and adhesion layer 1420, the layers or films may be present as an integrated liner layer comprising both barrier and adhesive properties with or without a discrete interface.

To form an integrated liner layer or a barrier layer or adhesive layer, an organometallic substituent may be introduced according to an ALD or CVD process. Representatively, the organometallic precursor is selected from families, such as, but not limited to, imines, amines, cyclic arenes, carbenes, halides, carbonyls, alkenes and transition and other metal centers such as, but not limited to, tantalum (Ta), titanium (Ti), tungsten (W), copper (Cu), ruthenium (Ru), molybdenum (Mo), iridium (Ir), platinum (Pt), and palladium (Pd) and other refractory metal compounds from D-block elements including groups 3-11 in the Periodic Table of the Elements. Specific examples of single metal center organometallic precursors that have tantalum (Ta), as the single metal center include the cyclopentadienyl (Cp) compounds $Cp_2TaH_3$; $CpTa(CO)_4$; $(MeCp)Ta(CO)_4$; $CpTa(CO)_3(R)$, where R is $PPh_3$, $AsPh_3$, or any other neutral 2 electron donor; $CpTa(CO)_3(R)$, where R is THF, $PPh_3$, $PCy_3$, or any other neutral 2 electron donor; $CpTa(CO)_2(C_5H_5)$; $Cp_2TaH(CO)$; $Cp_2TaR(CO)$, where R is methyl (Me), $CH_2$-phenyl, phenyl (Ph), or any other negatively charged 2 electron donor; $Cp_2TaH(CH_2=CHR')$, where R' is H, Me, Et, Pr, or Ph; $Cp_2Ta(CH_2CH_2R')(CNR)$, where R and R' are each independently chosen from hydrogen (H), Me, ethyl (Et), propyl (Pr), Ph, or any other negatively charged 2 electron donor; $CpTaX-Me(CHCMe_3)$, where X is Cl, Me, or any other negatively charged 2 electron donor; $Cp'TaX(CH_2Ph)(CHPh)$, where Cp' is $C_5H_4Me$, $C_5Me_5$, or any other functionalized cyclopentadienyl ligand, and where X is chlorine (Cl), $CH_2Ph$, or any other negatively charged 2 electron donor; $Cp*Ta(PMe_3)$ $(C_2H_4)(CHCMe_3)$; $Cp_2TaMe(CH_2)$; $Cp(MeCp)TaMe(CH_2)$; $Cp_2TaMe(CHR)$, where R is H, Me, Ph, $SiMe_3$, or any other negatively charged 2 electron donor; $Cp_2Ta(CHPh_2)$ $(CHCMe_3)$; $Cp_2Ta(CH_2Ph)(CHPh)$; $Cp*TaMe_3Ph$;

Cp*TaMe₂(Me₂CO); Cp*TaMe₂(C₂H₄); Cp₂TaMe₃; Cp₂TaPh₂; Cp*TaMe₄; Cp₂Ta(Cp)₂; Cp'Me₂Ta(indenyl); Cp₂TaH(CH₂=CHR), where R is Me, Et, nPr, or any other negatively charged 2 electron donor; Cp₂Ta(cyclopentene); Cp₂Ta(benzyl)(CHPh); Cp₂ClTaCH(tBu); CpTa(CH(tBu)X (PMe₃)₂, where X is H, Me, Et, Pr, halide, or Ph; Cp₂TaMe (C₂H₄); CH₂=Ta(Cp)₂CH₃; Cp₂Ta(nPr)(C₈H₈); CpTa(CO)ₓ (PhCCPh), where x equals 1 or 2; Cp₂Ta(allyl); Cp₂Ta (methallyl); Cp'TaH₃; Cp₂TaH(CO); Cp₂TaH(propene); Cp₂TaMe₃; Cp*TaCO₄; Cp*TaMe₄; Cp₂Ta(nPr)(CNMe); Cp*TaMe₂(benzene); Cp*Ta(CHCMe₃)(ethene)PMe₃; Ta(CO)₃(C₇H₇); Ta₂(CO)₁₂; TaH(CO)₂(Dmpe)₂; TaX(CO)₂ [Me₂P(CH₂)₂PR₂]₂, where X is Cl, I, or any other negatively charged 2 electron donor and R is Et, iPr, or any other negatively charged 2 electron donor; (RHg)Ta(CO)₄, where R is Et, Ph, or any other negatively charged 2 electron donor; Ph₃SnTa(CO)₄; [(C₅H₄nBu)Ta(CO)₃{Si(Cl₈H₃₇)₂}]₂; ((CH₃)₃CCH₂)₃Ta=CHC(CH₃)₃; ((R₁ₐCR₂ₐR₃ₐ) ((R₁ᵦCR₂ᵦR₃ᵦ) ((R₁ᵨCR₂ᵨR₃ᵨ)Ta=CR₄R₅ where Rₙ is H, Me, Et, iPr, nPr, tBu, sBu, iBu, nBu, amyl, F, Cl, Br, I, or any other negatively charged 2-electron donor; Ta(allyl)₄; Ta(1-methylallyl)(C₄H₆)₂; and TaMe₅.) and other Ta single metal center organometallic compounds such as complexes of the type: TaXR₄, TaX₂R₃, TaX₃R₂, TaX₄R including metallacyclic compounds where X is a halide, such as Cl, or pseudohalide, such as CN⁻, and R is a negatively charged 2-electron donor, such as a methyl group. A preferred embodiment employs Ta(NEt₂)5 and the NH₃ coreactant.

In the embodiment, an organometallic substituent introduced by ALD or CVD is made up of a metal ligand bonded to an organic ligand. In one embodiment, an organometallic substituent is introduced into a chamber in the presence of a substrate that is biased, for example, negatively biased (e.g., a portion of the substrate has a negative electric charge). The substrate bias may be applied before or after the introduction of an organometallic substituent into the chamber. Without wishing to be bound by theory, the addition of electrons to the precursor molecules under adequate bias will reduce the metal centers (decreasing their oxidation state to zero). Concomitant removal of the ligands will result in the formation of a metal layer. This may be represented as:

$$MX_n \rightarrow (\text{adsorption}) \; MX_n + ce^- \rightarrow M^0 + X_n,$$

wherein the M represents a metal ligand and X represents an organic ligand. $MX_n$ is an organometallic substituent that, in this example, is adsorbed on a substrate. $M^0$ represents the "reduced" and elemental form of the metal. "ce" represents a negative electric charge supplied, in this embodiment, by a negative electric current (e.g., a direct current). Representatively, the current or electric charge applied to substrate is described as negative to provide electrons for the reduction of an ionically positive metal to a neutral state. It is appreciated that, in another example, the bias of a substrate may be positive. The amount of electrical bias may be determined, in one embodiment, by the reduction potential of the metal ligand. For example, tantalum has a reduction potential of –0.81 from $Ta^{5+}$ to $Ta^0$. Copper has a reduction potential of –0.34 volts from $Cu^{2+}$ to $Cu^0$. The amount of electrical bias may equal or exceed the reduction potential of the metal ligand of the organometallic substituent. In another embodiment, the electrical bias may be less than the reduction potential and reduction of a metal ligand may rely, in part, on a co-reactant.

Figure 2:
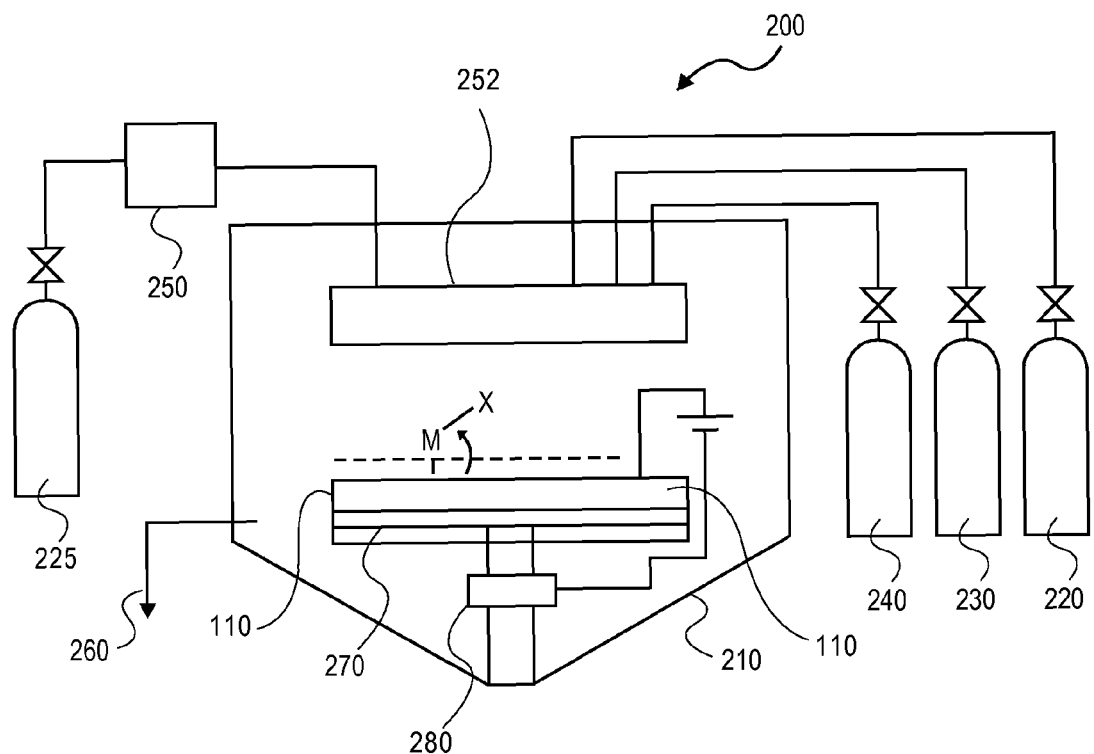
FIG. 2 shows a schematic side view of a chamber suitable for chemical vapor deposition or atomic layer deposition processing.

FIG. 2 shows a schematic of a representative system for forming a layer such as a barrier layer on a substrate by ALD or CVD. System 200 includes chamber 210 having an interior volume suitable to accommodate a substrate, such as semiconductor wafer 110. Connected to an interior volume of chamber 210 are a number of process gas sources, including gas source 220 that delivers, for example, an organometallic substituent; gas source 230 that delivers, for example, a co-reactant; and gas source 240 of a purge or other gas source. The gas sources are shown connected to showerhead 252 assembly that may be used to distribute the gases on a plasma of the gases through the chamber. In this embodiment, also connected to chamber 210 is remote plasma activator 250. Remote plasma activator 250 is separate from and communicates with chamber 210. Alternatively or additionally, a plasma activator may be operated directly in chamber 210 (e.g., a capacitively coupled plasma electrode). In one example, a plasma activator such as remote plasma activator 250 and/or a plasma activator in chamber 210 includes a plasma or ionization source for activating gas source 225, such as a co-reactant (e.g., a hydrogen or other gas source(s)) for introduction of an activated co-reactant into chamber 210 (plasma source to include ions, electrons, protons and radicals of the activated gas). The plasma source may be described in terms of energy density related to factors such as an energy applied to the gas source at the plasma activator (e.g., to establish a concentration of activated species in the plasma source) and the distance of plasma activator from a substrate surface in chamber 210. Energy density is one variable associated with a plasma source. Other variables include the duration or exposure time of the substrate (or reactants) to the plasma source and when a plasma source is introduced. In one embodiment, the plasma source may be introduced during more than one of the pulses of an ALD process (e.g., during the purge pulse, co-reactant pulse or both).

System 200 also includes an example of a temperature source (shown as temperature source 270) that may be used to heat an interior of chamber 210 to a desired temperature for a reaction between the substrate and the precursor or precursor and co-reactant. FIG. 2 shows temperature source 270 disposed within chamber 210 (in this case, within a stage within the chamber). It is appreciated that a suitable reactor may include hotwall or coldwall chambers. FIG. 2 also shows evacuation source 260 connected to an interior chamber 210 to evacuate reactive species or process gases from the chamber. Evacuation source 260 may be connected to a vacuum pump or other source.

System 200 also includes voltage source 280 that is capable providing an electric charge to a substrate in chamber 210 through, for example, a direct current. In FIG. 2, voltage source 280 is shown connected to substrate 205 to provide an electric charge or bias to substrate 205. Representatively, a bias is applied to the substrate such that current flows from the substrate to ground. The substrate acts like a plate of a capacitor allowing charge to accumulate on the substrate. A suitable voltage source is a source that supplies a positive or negative bias between 5 and 200V to the substrate or a current that results in 5× increase or decrease in surface charge (e.g. about 6.2 E18 electrons). The actual current value will be dependent on the film resistance.

As shown in FIG. 2, in one embodiment, gas source 220 provides an organometallic substituent, in the form of a gas, into chamber 210 through showerhead 252. The organometallic substituent may adsorb (chemiadsorb) on substrate 110 or may otherwise contact substrate 110. Prior to, at the same time or after the organometallic substituent is provided (introduced) into chamber 210 or adsorbs or otherwise contacts substrate 110, an electric charge is applied to substrate 110 (e.g., a negative charge). It is believed that the electric charge aids in the reduction of the metal ligand of the organometallic substituent as well as weakening bond between the metal ligand and the organic ligand of the organometallic substituent. In this manner, the metal ligand ($M^{n+}$) may be formed as a metal ($M^0$) is a solid state on the substrate.

In one embodiment of a process for depositing a metal on substrate 110 using an organometallic substituent, substrate 110 may be pre-treated by exposing the substrate to a plasma precursor pulse from gas source 225. In one embodiment, a precursor such as hydrogen ($H_2$) may be used to pre-treat a substrate. The precursor plasma pulse provides hydrogen ions, electrons, protons and radicals that may aid in a reduction of a metal ion to neutral metal. Next, an organometallic substituent of a metal such as tantalum (T), niobium (Nb), molybdenum (Mo), copper (Cu) or a titanium (Ti) is introduced (e.g., pulsed or flown) into chamber 210. Thus, for example, gas source 220 may contain the organometallic substituent in a gas state and the organometallic substituent may be introduced through showerhead 252. An electric charge may be applied to substrate 110 preceding the introduction of the organometallic substituent or at the same or shortly thereafter (e.g., after the organometallic substituent has adsorbed on substrate 110). The supply of an electrical current (and also the charge) to the substrate provides electrons for an oxidation-reduction reaction in which the metal ligand of the organometallic substituent is reduced. In one embodiment, at the same time or shortly after introduction of the organometallic substituent, a co-reactant may be introduced into the chamber such as hydrogen ($H_2$), oxygen ($O_2$), water ($H_2O$), or silane ($SiH_4$), possibly with plasma activation, that will react or otherwise combine with the organic ligand of the organometallic substituent. In one embodiment, the reaction or other combination with the organic ligand produces a stable, volatile gas that may be purged from chamber 210. The substrate may or may not be biased during the introduction of a co-reactant.

In the above discussion, a substrate is biased with an electric charge that is applied to substrate 110. Representatively, the current is described as a negative current. On the other hand if the voltage is reversed, a subsequent decrease in the electron density at the film will be considered a positive bias.

In another embodiment, the bias applied to a substrate, such as substrate 110, may have a magnitude that may be modified during deposition or at different times during the deposition process. For example, a first negative bias may be applied while an organometallic substituent is introduced into chamber 210 and allowed to adsorb on substrate 110. Such negative bias may not be sufficient to reduce the metal ligand, but could be sufficient to encourage a dissociation of the ligands. A second negative bias may then be applied that is sufficient to achieve the complete dissociation of the ligands and the reduction of the metal ligand to neutral metal.

Figure 3:
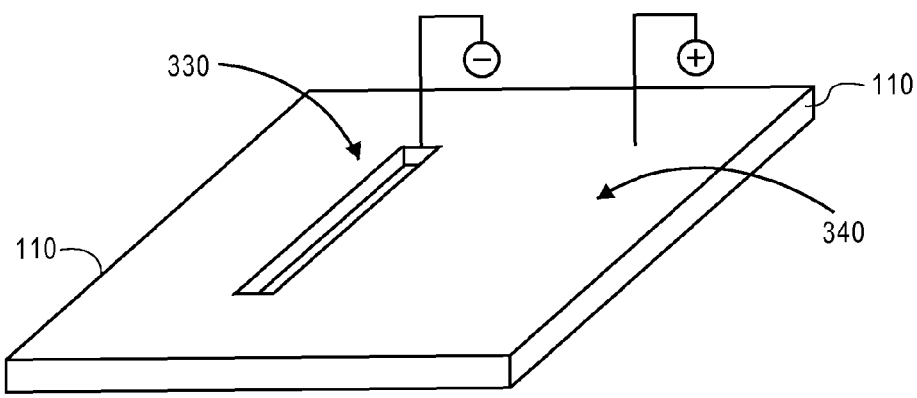
FIG. 3 shows a schematic, top perspective view of a portion of a substrate having an electrical bias applied thereto.

In another embodiment, a portion of a substrate, such as an area designated for a deposition of a metal to occur, may have one bias, such as a bias suitable for the reduction of a metal ligand, while another portion of the substrate (in another area of the substrate where deposition is not desired), may have a different (e.g., a different negative bias or even a positive bias) to inhibit deposition of a metal in that portion. FIG. 3 shows a top perspective view of substrate 110 including area 330 where it may be desired to deposit a metal, such as tantalum in a trench and via opening. Substrate 110 also includes a second area 340 where it is desired not to have a metal deposition. As shown in this example, substrate 110 is biased negatively in the area of area 330 positively in an area 340. In this manner, metal may be deposited in area 330 but not in area 340. Such positive bias in area 340 may be selected in one embodiment to be sufficient to inhibit adsorption of an organometallic substituent in this area.

Figure 4:
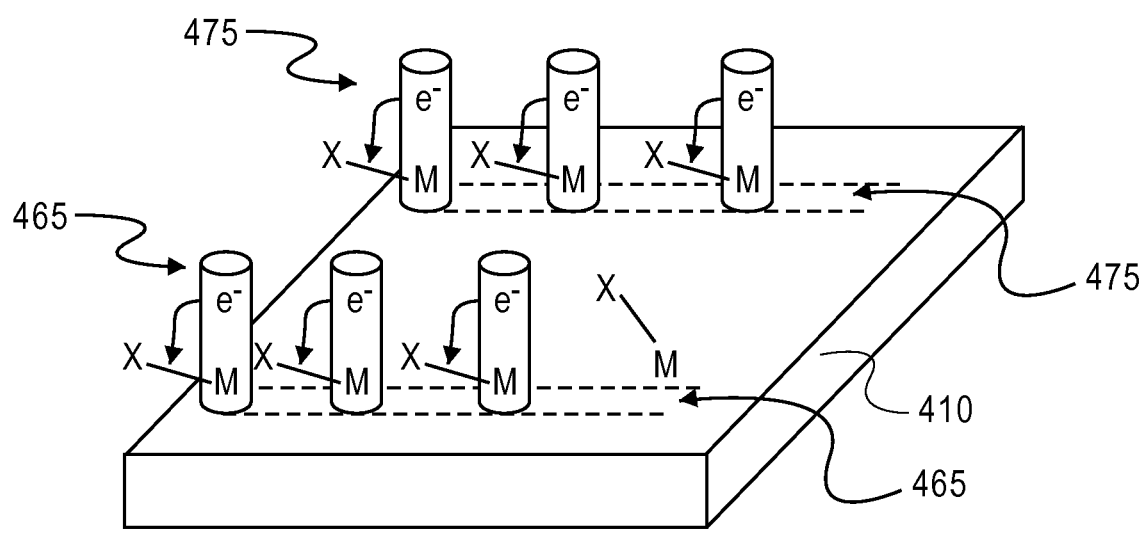
FIG. 4 shows a schematic top perspective view of a portion of a substrate having an organometallic substituent adsorbed on a surface thereof and an electron beam rastering operation.

In the above-referenced embodiments, a substrate is biased by providing an electric charge through, for example, a current source to a substrate. In another embodiment, rather than supply an electric charge through a current source to a substrate, an electron beam may be used to provide a source of electrons to activate certain parts of a substrate. FIG. 4 shows substrate 410 that has been exposed to an organometallic substituent in a chamber such as chamber 210 (see FIG. 2). Exposure of the organometallic substituent to the substrate may create an adsorbed (e.g., a chemisorbed) layer of the organometallic substituent on the substrate. While the substrate is still in the chamber or alternatively after the substrate has been removed from the chamber, an electron beam, such as an electron beam having a beam width on the order of ten to 100 nanometers is rastered across selected areas of substrate 410. Representatively, an electron beam may be applied from a thermoionic source of electrons or other source or cathodes and anodes to assist in accelerating and/or focusing the beam. FIG. 4 shows electron beam being rastered in areas 465 and 475 to provided a source of electrons to disrupt the bonding between the metal ligand and the organic ligand of the organometallic substituent and a reduction of the metal from an ionic state to a metallic state. In another embodiment, a co-reactant such as hydrogen, oxygen, water or silane, optionally in the form of a plasma, may be introduced prior to the electron beam rastering to achieve a reduction of the metal ligand or to aid in the reduction of the metal ligand to a metallic state. In another embodiment, an electron beam can be modified to tailor a rate of electron exchange with an adsorbed organometallic substituent.

In one embodiment, the application of an electric charge to or on a surface of a substrate may be modified during deposition to enhance or reduce a deposition rate of a precursor. For example, in an operation where it is desired to reduce a metal ligand of an organometallic substituent, an electric charge may be added to or may be applied on a surface of a substrate to enhance a reduction of the metal ligand in conjunction with a co-reactant. In this manner, the applied electric charge and the co-reactant collectively combine to reduce the metal ligand. Alternatively, in a situation where a deposition rate may be desired to be controlled, an electric charge applied to or on the surface of the substrate may be modified during deposition to control the rate. Still further, a conformality of a deposited film can be tailored by modifying a surface angle of structures on a substrate. For example, a trench and via for an interconnect typically includes vertical sidewalls as well as a horizontal surfaces (when a substrate lies horizontally on a stage in a chamber). It is desired, in one embodiment, that a deposition of a metal film such as a barrier layer be deposited conformally on the sidewalls and the horizontal surfaces defined by the trench and via (i.e., a similar film thickness on the sidewalls and horizontal surfaces). One way to encourage conformal deposition is to increase a charge density along the vertical sidewalls. In other words, increasing an applied charge to the vertical sidewalls relative to the horizontal surfaces in a trench and via can encourage deposition of a metal on the vertical sidewalls relative to the horizontal surfaces. Accordingly, a more conformal layer may be achieved.

In the above-referenced embodiment, a description is presented for depositing a metal film through the use of an electric charge is applied to or on a substrate to modify an organometallic substituent (e.g., a substituent into a reaction to free a metal ligand from an organic ligand or to modify a metal ligand (e.g., reduce a metal ligand) to form a metal on a substrate. The methods may be used, for example, to create a barrier layer in a trench and via designated for an interconnection (see, for example, barrier layer 1410 in FIG. 1), a seed layer in a trench and via designated for an interconnection (e.g., second material 150 in FIG. 1) and the other method where another layer, such as a pure (uncontaminated) metal layer deposition is desired.

Figure 5:
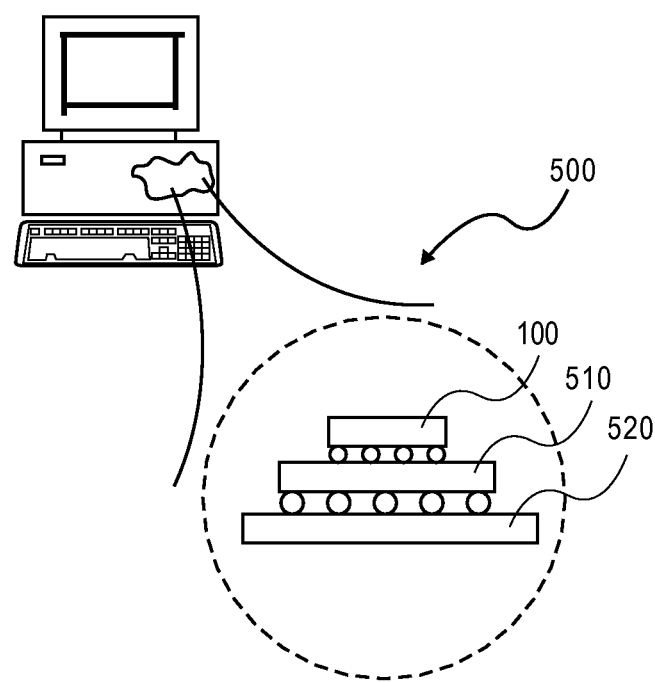
FIG. 5 shows a computer system including a microprocessor having interconnect lines formed according to techniques/methods described with reference to FIGS. 1-4.

FIG. 5 shows a cross-sectional side view of an integrated circuit package that can be physically and electrically connected to a printed wiring board or printed circuit board (PCB) to form an electronic assembly. The electronic assembly can be part of an electronic system such as a computer (e.g., desktop, laptop, handheld, server, etc.), wireless communication device (e.g., cellular phone, cordless phone, pager, etc.), computer-related peripheral (e.g., printer, scanner, monitor, etc.), entertainment device (e.g., television, radio, stereo, tape and compact disc player, video cassette recorder, MP3 (motion picture experts group, audio layer 3 player, etc.), and the like. FIG. 5 illustrates the package is part of a desktop computer. FIG. 5 shows electronic assembly 500 including die 100 (see FIG. 1 and the accompanying text) physically and electrically connected to package substrate 510. Die 100 is an integrated circuit die, such as a microprocessor die having, for example, transistor structures interconnected or connected to power/ground or input/output signals external to the die through interconnect lines (interconnection) formed as described with reference to FIGS. 1-4. Electrical contact points (e.g., contact pads on a surface of die 100) are connected to package substrate 510 through, for example, a conductive bump layer. Package substrate 510 may be used to connect die 100 to printed circuit board 520, such as a motherboard or other circuit board.

In the preceding detailed description, reference is made to specific embodiments thereof. It will, however, be evident that various modifications and changes may be made thereto without departing from the broader spirit and scope of the following claims. The specification and drawings are, accordingly, to be regarded in an illustrative rather than a restrictive sense.

What is claimed is:

1. A method comprising:
   activating a voltage source coupled to a substrate in a chamber to apply an electric charge to bias the substrate;
   introducing an organometallic substituent into the chamber, the organometallic substituent comprising a metal ligand and an organic ligand; and
   depositing a metal film by the electric charge reducing the metal ligand of the organometallic substituent,
   wherein the electric charge is at least equal to a reduction potential of the metal ligand.

2. The method of claim 1, wherein introducing an organometallic substituent into the chamber precedes applying the electric charge to the substrate.

3. The method of claim 1, wherein prior to depositing a metal film, the method comprises introducing a molecular substituent suitable for reacting with the organic ligand of the organometallic substituent.

4. The method of claim 1, further comprising introducing a molecular substituent suitable for reacting with the organic ligand of the organometallic substituent with plasma activation.

5. The method of claim 1, further comprising:
   after introducing an organometallic substituent into the chamber, removing the electric charge applied to the substrate; and
   after removing the electric charge, introducing a molecular substituent suitable for reacting with the organic ligand of the organometallic substituent with plasma activation.

6. The method of claim 1, further comprising:
   modifying the electric charge during depositing of the metal film.

7. A method comprising:
   activating a voltage source coupled to a substrate in a chamber to supply a removable electric charge to bias the substrate;
   in the presence of the applied electric charge from the voltage source, introducing an organometallic substituent into the chamber, the organometallic substituent comprising a metal ligand and an organic ligand; and
   depositing a metal film by the electric charge reducing the metal ligand of the organometallic substituent,
   wherein the electric charge is at least equal to a reduction potential of the metal ligand.

8. The method of claim 7, wherein prior to depositing a metal film, the method comprises introducing a molecular substituent suitable for reacting with the organic ligand of the organometallic substituent.

9. The method of claim 7, further comprising introducing a molecular substituent suitable for reacting with the organic ligand of the organometallic substituent with plasma activation.

10. The method of claim 7, further comprising:
    after introducing an organometallic substituent into the chamber, removing the electric charge applied to the substrate; and
    after removing the electric charge, introducing a molecular substituent suitable for reacting with the organic ligand of the organometallic substituent with plasma activation.

11. The method of claim 7, further comprising:
    modifying the electric charge during depositing of the metal film.

12. The method of claim 7, wherein applying a removable electric charge to a substrate comprises applying an electric charge to at least one pre-selected area representing less than the entire area of the substrate.

13. The method of claim 12, wherein the pre-selected area is an area pre-selected for metal deposition.

* * * * *